United States Patent
Singleton et al.

(10) Patent No.: US 9,017,832 B2
(45) Date of Patent: Apr. 28, 2015

(54) MAGNETIC ELEMENT ELECTRODE LAMINATION

(71) Applicant: Seagate Technology LLC, Cupertino, CA (US)

(72) Inventors: Eric Walter Singleton, Maple Plain, MN (US); Liwen Tan, Eden Prairie, MN (US); Jae-Young Yi, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 69 days.

(21) Appl. No.: 13/756,044

(22) Filed: Jan. 31, 2013

(65) Prior Publication Data

US 2014/0212691 A1  Jul. 31, 2014

(51) Int. Cl.
| | |
|---|---|
| G11B 5/39 | (2006.01) |
| G01R 33/00 | (2006.01) |
| G11C 11/00 | (2006.01) |
| G11B 5/62 | (2006.01) |
| G01R 33/09 | (2006.01) |
| G11C 11/14 | (2006.01) |

(52) U.S. Cl.
CPC ............... *G11B 5/62* (2013.01); *G01R 33/091* (2013.01); *G11C 11/14* (2013.01); *G01R 33/093* (2013.01)

(58) Field of Classification Search
None
See application file for complete search history.

(56) References Cited

U.S. PATENT DOCUMENTS

| | | | | |
|---|---|---|---|---|
| 6,114,719 | A * | 9/2000 | Dill et al. | 257/295 |
| 6,208,491 | B1 | 3/2001 | Pinarbasi | |
| 6,460,243 | B1 * | 10/2002 | Pinarbasi | 29/603.14 |
| 6,621,667 | B1 | 9/2003 | He et al. | |
| 7,027,322 | B2 * | 4/2006 | Suzuki et al. | 365/158 |
| 7,602,000 | B2 * | 10/2009 | Sun et al. | 257/295 |
| 8,288,023 | B2 * | 10/2012 | Gao et al. | 428/811.1 |
| 8,462,461 | B2 * | 6/2013 | Braganca et al. | 360/125.3 |
| 8,493,777 | B2 * | 7/2013 | Ranjan et al. | 365/171 |
| 2002/0009616 | A1 * | 1/2002 | Kamiguchi et al. | 428/692 |
| 2002/0048128 | A1 * | 4/2002 | Kamiguchi et al. | 360/324.1 |
| 2002/0093773 | A1 * | 7/2002 | Pinarbasi | 360/322 |
| 2005/0207219 | A1 * | 9/2005 | Lee et al. | 365/173 |
| 2010/0097729 | A1 * | 4/2010 | Gill et al. | 360/324 |

* cited by examiner

*Primary Examiner* — Kevin Bernatz
(74) *Attorney, Agent, or Firm* — Hall Estill Attorneys at Law

(57) ABSTRACT

Various embodiments may be generally directed to a magnetic element capable of optimized magnetoresistive data reading. Such a magnetic element may be configured at least with a magnetoresistive stack that has an electrode lamination having at least a transition metal layer disposed between a magnetically free layer of the magnetoresistive stack and an electrode layer of the electrode lamination.

18 Claims, 4 Drawing Sheets

US 9,017,832 B2

MAGNETIC ELEMENT ELECTRODE LAMINATION

SUMMARY

Various embodiments of the present disclosure are generally directed to a magnetic element that is capable of at least magnetic data bit reading.

In accordance with some embodiments, a magnetic element may be configured at least with a magnetoresistive stack that has an electrode lamination having at least a transition metal layer disposed between a magnetically free layer of the magnetoresistive stack and an electrode layer of the electrode lamination.

DETAILED DESCRIPTION

Advancement of data storage devices into higher data capacities and faster data access times has continually reduced data storage dimensions to the point where magnetic stability and noise mitigation have become difficult to ensure. The minimization of data track widths combined with increased data bit density reduces the available size of data transducing components, such as the thickness of magnetically sensitive layers. Such minimized physical size can degrade data bit resolution, signal-to-noise ratio, and shield-to-shield spacing as transducer resistance increases. Thus, there is a continued industry demand for reduced form factor data access elements with more robust magnetic stability and data bit resolution.

Accordingly, a magnetic element may be configured with a magnetoresistive stack that has an electrode lamination with at least a transition metal layer disposed between a magnetically free layer of the magnetoresistive stack and an electrode layer of the electrode lamination. The inclusion of the transition metal layer in the magnetoresistive stack allows for the mitigation of processing and design variations that can stress the magnetic operation of layers with reduced physical size. The ability to tune the transition metal layer at least for material, thickness, and shape allows the magnetic operation of a magnetic element to be catered to a wide variety of data storage environments.

Figure 1:
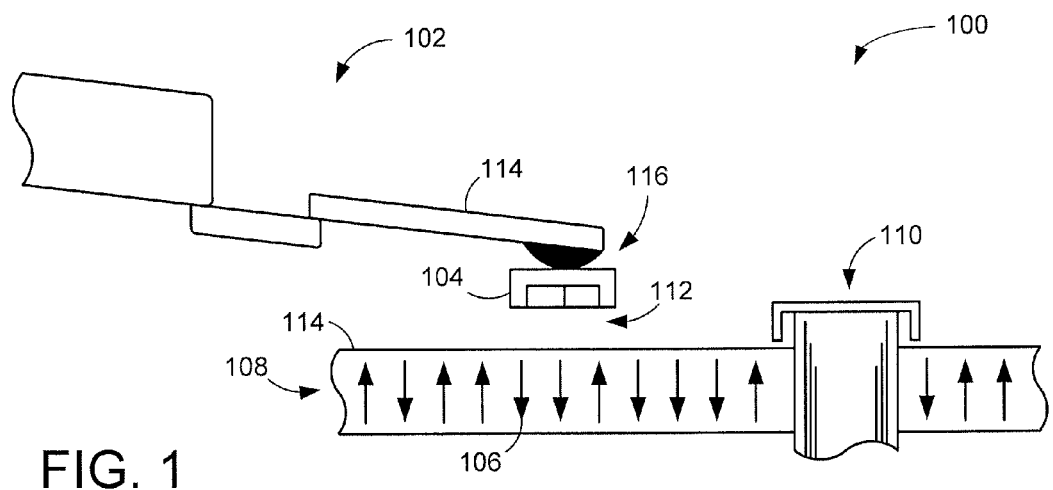
FIG. 1 is a block representation of a portion of an example data storage device in accordance with some embodiments.

FIG. 1 displays a transducing portion 100 of an example rotating data storage environment capable of being tuned with an electrode lamination in accordance with various embodiments. The transducing portion 100 is shown configured with an actuating assembly 102 that positions a transducing head 104 over programmed data bits 106 present on a magnetic storage media 108 that is attached to, and rotates about, a spindle motor 110 to produce an air bearing surface (ABS) 112. The speed in which the spindle motor 110 rotates allows a slider portion 114 of the actuating assembly 102 to fly on the ABS to position a head gimbal assembly (HGA) 116, which includes the transducing head 104, over a desired portion of the media 108.

The transducing head 104 can include one or more transducing elements, such as a magnetic writer and magnetically responsive reader, which operate to program data to and read data from the storage media 108, respectively. In this way, controlled motion of the actuating assembly 102 and spindle motor 110 can modulate the position of the transducing head both laterally along predetermined data tracks (not shown) defined on the storage media surfaces and vertically as measured perpendicularly to the media surface 114 to selectively write, read, and rewrite data.

As ferromagnetic materials are deposited in reduced dimensions, such as on a nanometer scale, manufacturing can produce a magnetically "dead layer" for a portion of the ferromagnetic film that becomes a more and more significant portion of a device film with ever-decreasing device form factors. While the origins of the dead layer can come from a variety of sources, such as from ion milling and etching of the interface between two layers, the unpredictable extent of the dead layer can reduce the functional thickness of the magnetic layers and the ability to minimize the size of the overall transducing head 104.

Figure 2:
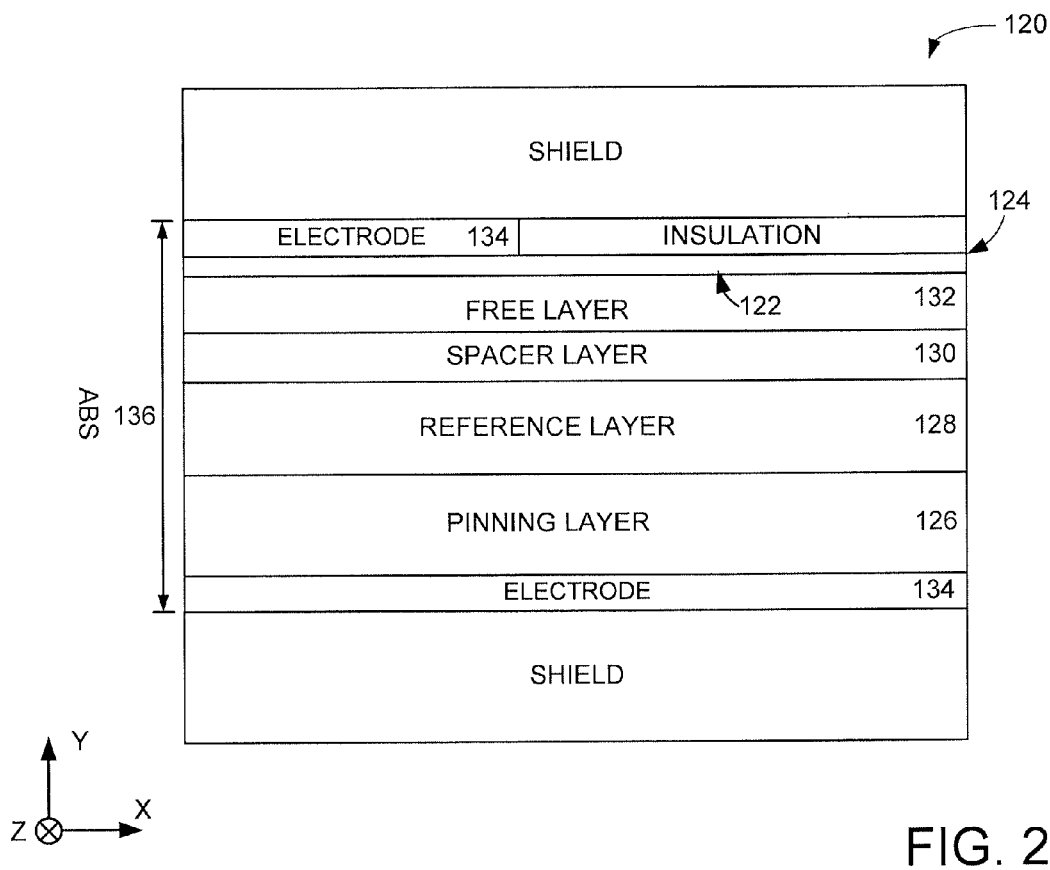
FIG. 2 shows a block representation of an example magnetic data reader capable of being used in the data storage device of FIG. 1 in some embodiments.

FIG. 2 shows a cross-sectional block representation of an example magnetic element 120 having a dead layer portion 122 in accordance with some embodiments. As shown, a magnetoresistive (MR) stack 124 is constructed with a fixed magnetization pinning layer 126 contacting a fixed magnetization reference layer 128 opposite a non-magnetic spacer layer 130 from a magnetically free layer 132. While a dead layer portion 122 may be present at any interface between MR stack 124 layers, the dead layer portion 122 is displayed between the free layer 132 and an electrode layer 134, which may be a magnetic and non-magnetic seed, cap, and spacer layer in various embodiments. As the shield-to-shield spacing 136 is reduced to accommodate minimized data track widths and greater data bit densities, resistance in the MR stack 124 can increase and lead to magnetic noise and lower signal-to-noise ratio as interlayer coupling rises.

A reduction in shield-to-shield spacing 136 can correspond with interlayer coupling between the free 132 and reference 128 layers as the spacer layer 130 is decreased in thickness along the Y axis. Such interlayer coupling can degrade the magnetoresistive effect of the MR stack 124, which makes elevating signal-to-noise ratio difficult. Hence, the introduction of the dead layer portion 122 can increase interlayer coupling and restrict magnetic element 120 performance as the physical dimensions of the MR stack 124 are diminished and the operational portions of the stack 124 are compromised.

Figure 3:
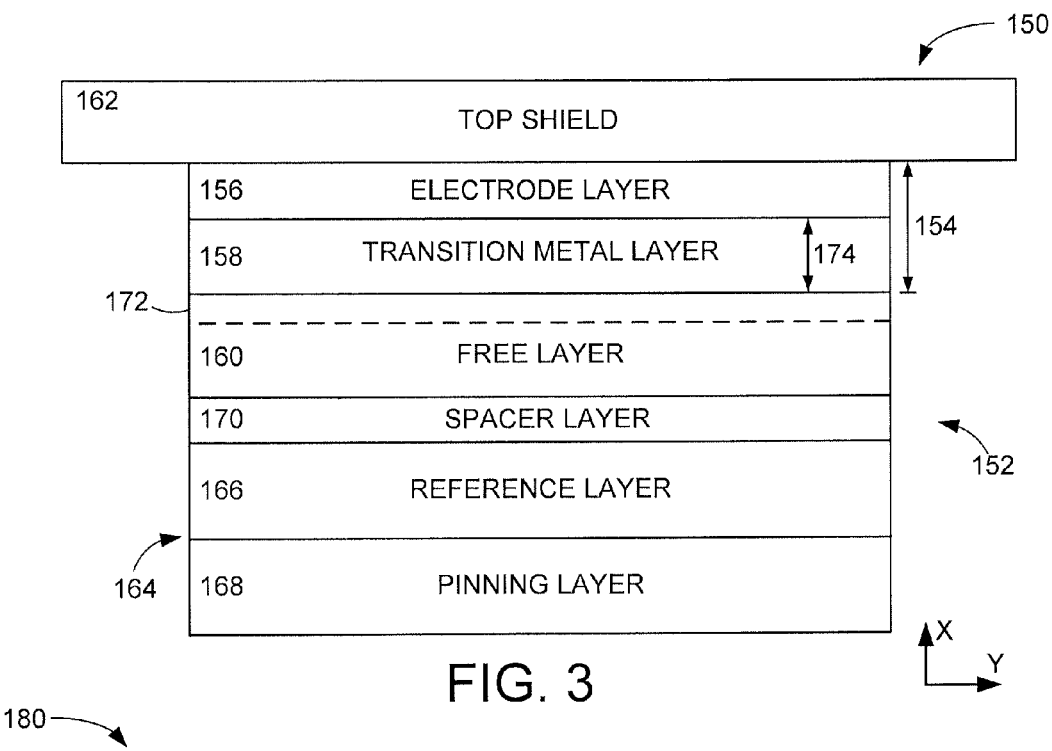
FIG. 3 displays an air bearing block representation of an example magnetic stack in accordance with various embodiments.

FIG. 3 provides an air bearing view block representation of an example magnetic element 150 tuned to reduce interlayer coupling while minimizing shield-to-shield spacing in accordance with various embodiments. The magnetoresistive (MR) stack 152 is configured with an electrode lamination 154 that has an electrode layer 156 and transition metal layer 158 positioned between a magnetically free layer 160 of the MR stack 152 and a magnetic shield 162. The MR stack 152 has a fixed magnetization reference structure 164 comprising pinning 166 and reference 168 layers opposite a non-magnetic spacer layer 170 from the free layer 160.

While not limited to such a configuration, the electrode layer 156 can be constructed of materials like tantalum and ruthenium that promotes growth of magnetic layer, but can introduce a dead layer 172 at the interface between the electrode 156 and free layers 160, as depicted in FIG. 3. The placement of the interfacial transition metal layer 158 between the electrode 156 and free 160 layers can reduce, or eliminate, the formation of the dead layer 172 as magnetic coupling, free layer 160 magnetic coercivity, and reference layer 168 magnetic coercivity are reduced. The addition of the transition metal layer 158 can retain greater magnetic moment than if Ta and Ru are adjacent free layer 160, which contributes to higher anisotropy and reduced interlayer coupling as the dead layer 172 is minimized and more of the free layer 160 can be utilized.

With industry emphasis on decreased shield-to-shield spacing with robust MR stack 152 magnetic stability, the transition metal layer may be tuned in some embodiments for thickness 174, such as 0.1-1 nm, and material, such as Pt, Pd, Ir, Rh, to balance the reduction of the dead layer 172 with any increase in shield-to-shield spacing. As a non-limiting example, a platinum material transition metal layer 158 with an 0.8 nm thickness 174 can virtually eliminate the dead layer 172 from the free layer 160 and allow for optimized magnetic performance of the MR stack 152 with greater magnetic stability and reduced interlayer coupling as the size of the free layer 160 is balanced with the reference layer 166.

Tuning of the transition metal layer 158 can further reduce the shield-to-shield spacing of the magnetic element 150 as the thickness of the free 160 and reference 166 layers are thinner with the removal of thickness previously reserved for the dead layer 172. The construction of a tuned transition metal layer 158 as part of an electrode lamination 154 can provide a number of performance optimizations, such as greater hysteresis squareness, robustness to annealing, and reduced interlayer magnetic coupling, in addition to the reduced shield-to-shield spacing. The magnetic optimization provided by the electrode lamination 154 is not limited to proximity to the free layer 160.

Figure 4:
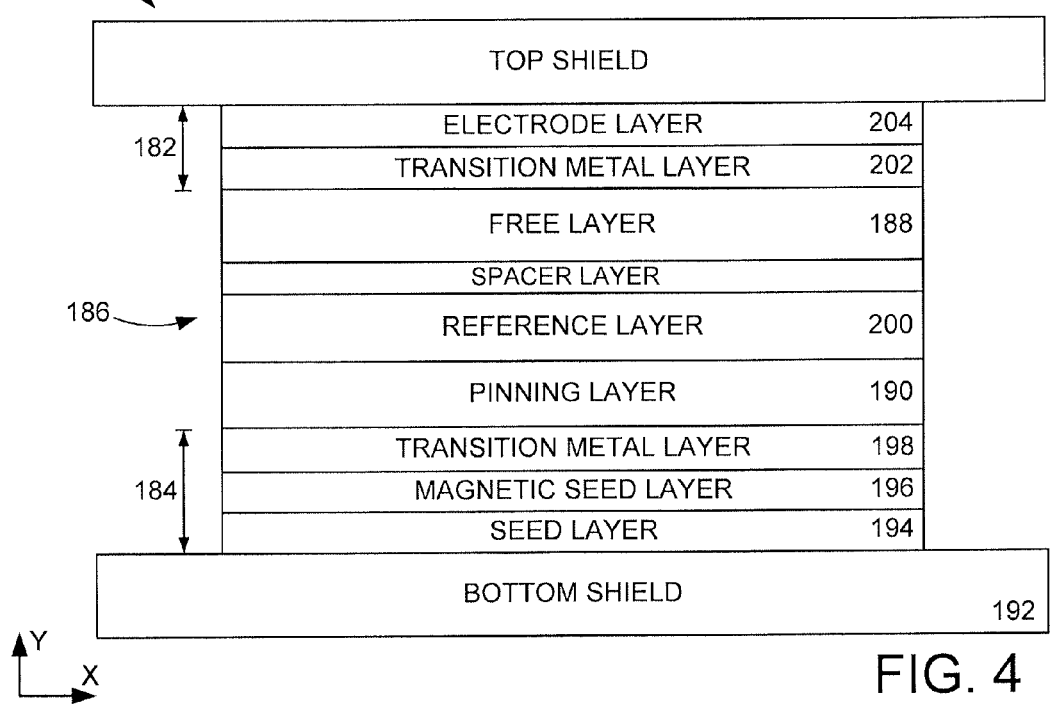
FIG. 4 generally illustrates an air bearing block representation of an example magnetic element constructed in accordance with some embodiments.

FIG. 4 illustrates an air bearing view block representation of another example magnetic element 180 that employs multiple electrode laminations 182 and 184 on opposite vertical ends of an MR stack 186 in accordance with some embodiments. The reduction and virtual elimination of a dead layer portion of the free layer 188 of the MR stack 186 by the first electrode lamination 182 can be complemented by the second electrode lamination 184 positioned between the pinning layer 190 of the MR stack 186 and a bottom magnetic shield 192. While the first electrode lamination 182 can be tuned to control the formation of a dead layer, the second electrode lamination 184 can be tuned to control magnetic coercivity in the pinning layer 190 with a seed layer 194, magnetic seed layer 196 and second transition metal layer 198 without degrading the pinning magnetic field that sets the reference layer 200.

Through tuning the first 202 and second 198 transition metal layers to matching or dissimilar configurations, the grain size distribution of at least the pinning layer 190 can be optimized while the free layer 188 has a dead layer of less than 5% of its thickness. That is, the first transition metal layer 202 can have a thickness and material that relocates some, or all of a dead layer to the electrode layer 204 while the second transition metal layer 198 can have a different thickness and material to provide a predetermined magnetic coercivity and anisotropy of the pinning layer 190. The ability to tune a variety of magnetic characteristics in the magnetic element 180 with the addition of one or more electrode laminations allows for optimization of shield-to-shield spacing with increased magnetic stability, sensitivity, and signal-to-noise ratio.

Figure 5:
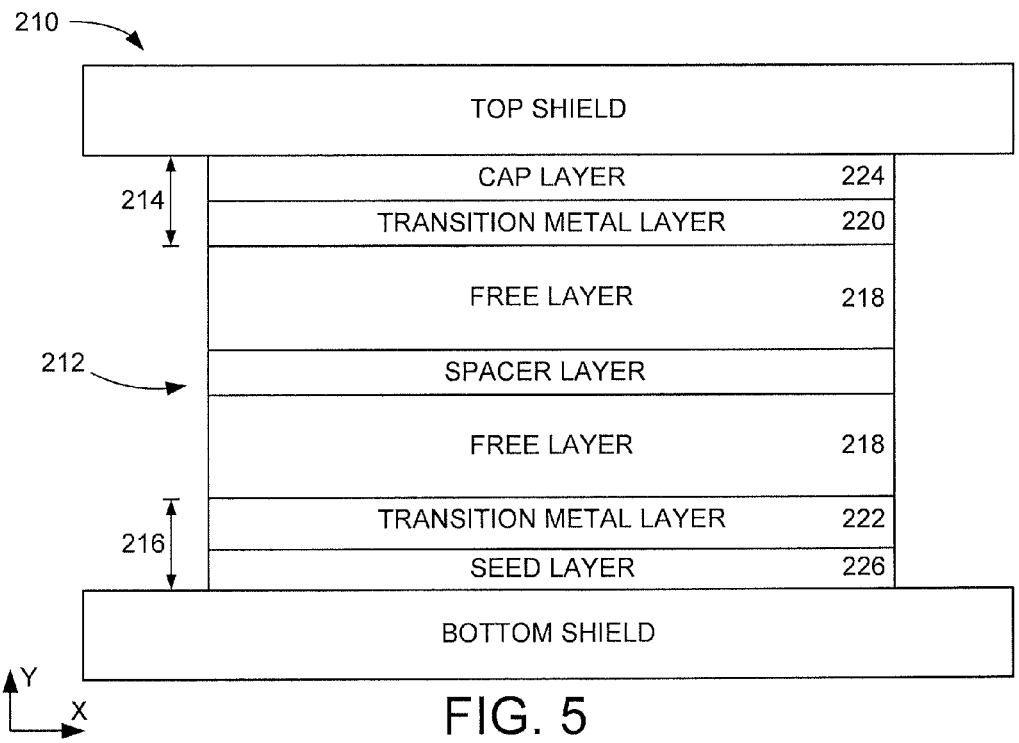
FIG. 5 shows an air bearing block representation of an example magnetic element configured in accordance with various embodiments.

In a non-limiting example of how the magnetic element 180 can be tuned, the first transition metal layer 202 can be omitted so that the second electrode lamination 184 is only incorporated into the magnetic element 180. The variety of magnetic structure and performance characteristics capable of being tuned to predetermined optimized parameters is not limited to an MR stack 186 with fixed magnetizations. FIG. 5 displays an air bearing block representation of an example magnetic element configured with a trilayer MR stack 212 and first 214 and second 216 electrode laminations tuned in accordance with various embodiments. The trilayer MR stack 212 can be characterized by dual magnetically free layers 218 and a lack of fixed magnetizations.

The free layers 218 of the MR stack 212 may be biased to predetermined default magnetizations, such as with a separated permanent magnet distal the air bearing, that scissor in response to an encountered magnetic data bit. The transition metal layers 220 and 222 of the respective electrode laminations 214 and 216 can be tuned to minimize the development of dead layers in the free layers 218 by relocating the magnetically dead portions to the cap 224 and seed 226 layer. Such electrode lamination 214 and 216 tuning can allow for thinner free layers 218 and shield-to-shield spacing while controlling the formation of dead layers and providing optimized magnetic performance with the free layers 218 being more efficient.

Figure 6:
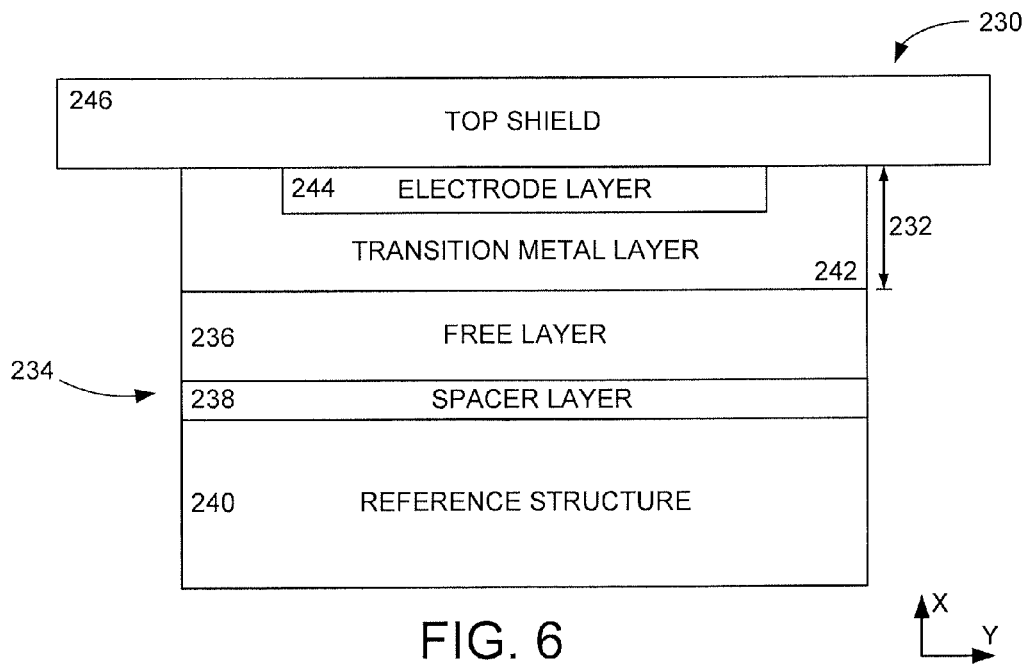
FIG. 6 displays an air bearing block representation of a portion of an example magnetic element constructed in accordance with some embodiments.

Various embodiments tune the magnetic element 210 by removing the first transition metal layer 220 to have a single transition metal layer 222 proximal the bottom shield. The material and thickness tuning of the electrode laminations, and especially the transition metal layer, is not the exclusive manners of controlling the formation of dead layers and magnetic coercivity. FIG. 6 shows an air bearing block representation of a portion of an example magnetic element 230 with a tuned electrode lamination 232 in accordance with some embodiments.

The magnetic element 230 is constructed with a fixed magnetization MR stack 234 comprising the electrode lamination 232 and magnetically free layer 236 opposite a non-magnetic spacer layer 238 from a fixed magnetization reference structure 240, such as an antiferromagnet and synthetic antiferromagnet. As shown, the electrode lamination 232 is tuned with a shaped transition metal layer 242 formed to contact the electrode layer 244 from orthogonal sides. The partial surrounding of the electrode layer 244 can manipulate the formation of any magnetically dead layers and allow for a thinner overall electrode lamination 232 as opposed to a uniform thickness transition metal layer, such as layer 220 of FIG. 5.

The transition metal layer shape 242 may act in concert with the top magnetic shield 246 to mitigate dead layer formation through the direct contact the two magnetic materials, such as Pt for layer 242 and NiFe for the shield 246. Such transition metal layer 242 shape can further increase magnetic stability of the MR stack 234 by minimizing resistance of the electrode lamination 232, which optimizes signal-to-noise ratio and decreases thermal magnetic distortion. While a shaped transition metal layer 242 that is thicker than and partially surrounds the electrode layer 244 may provide predetermined magnetic operation for the MR stack 234, the transition metal layer 242 shape displayed in FIG. 6 is not required or limiting. For example, the transition metal layer 242 may be shaped to have a continuously curvilinear central aperture in which the electrode layer 244 resides.

Regardless of the shape, thickness, material, and orientation of the transition metal layer 242, the tuned electrode lamination 232 can modify the interface between the magnetically free layer 236 and the top shield 246 to control dead layer formation, magnetic coercivity, and anisotropy to provide predetermined magnetic element 230 performance catered to reduced form factor, high data bit density data storage environments.

Figure 7:
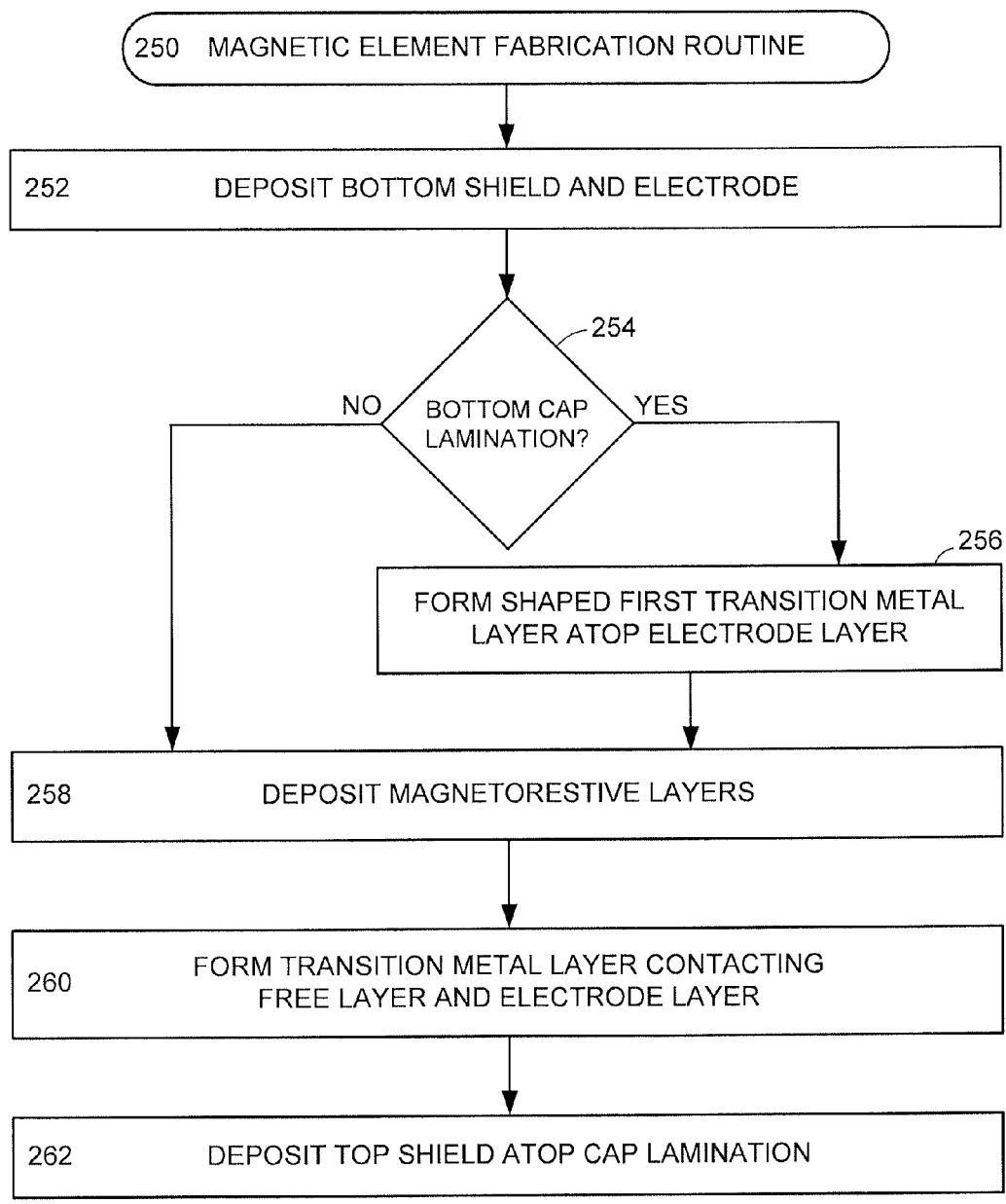
FIG. 7 provides a flowchart of a magnetic element fabrication routine carried out in accordance with various embodiments.

FIG. 7 maps an example magnetic element fabrication routine 250 capable of constructing a magnetic element with a tuned electrode lamination in accordance with various embodiments. A bottom shield and an electrode layer are initially deposited in step 252 with predetermined materials, thickness, and shapes. Decision 254 then evaluates whether or not an electrode lamination is to be positioned proximal the bottom shield. If an electrode lamination is chosen, step 256 forms a first transition metal layer atop the electrode layer. The first transition metal layer may be shaped in an endless variety of configurations that can have varying thicknesses, angled sidewalls, and apertures. The bottom electrode lamination may be tuned in some embodiments to control the magnetic coercivity of a subsequently deposited magnetic layer or in other embodiments to provide a predetermined grain size for the later formed magnetic layers.

At the conclusion of the formation of the first transition metal layer or if a bottom electrode lamination was not chosen in decision 254, step 258 subsequently deposits a number of magnetoresistive layers, such as magnetically free layer, non-magnetic spacer layer, and fixed magnetization reference structure, that magnetically respond to encountered data bits to provide a magnetoresistive effect. As illustrated in FIGS. 4 and 5, the magnetoresistive layers are not limited to a particular configuration and can be constructed as a trilayer lamination of free layers or a fix magnetization stack.

Step 258 is understood as depositing the magnetoresistive layers with predetermined thicknesses that may be matching or dissimilar to produce a predetermined shield-to-shield spacing. As discussed above, the predetermined thicknesses can be reduced without degraded magnetic performance by depositing a transition metal layer in step 260 to contact a magnetically free layer to mitigate or eliminate the formation of a magnetically dead layer. Step 260 may tune the transition metal layer in any variety of shapes, materials, and thickness that act in concert with the adjacent electrode layer to ensure predetermined growth of the magnetoresistive layers while controlling the location and size of any magnetically dead layers.

With the formation of at least one electrode lamination in a magnetoresistive stack, step 262 deposits a top shield in contact with the immediately prior formed electrode lamination. The completion of step 262 provides the air bearing portion of a magnetic element that is tuned to provide predetermined magnetic properties, such as coercivity and anisotropy, in addition to mitigating dead layer formation to allow a minimal shield-to-shield spacing. The routine 220, however, is not limited only to the steps and decisions provided in FIG. 7 as any number of steps can be added, omitted, and modified to accommodate the fabrication of a precisely tuned magnetic reader. For example, a decision could be added to decide the type of magnetoresistive layers are to be deposited in step 258, which could lead to the formation of a biasing magnet if a trilayer stack is chosen.

It can be appreciated that the configuration and material characteristics of the magnetic element described in the various embodiments shown in FIGS. 1-7 allows for dead layer mitigation with the formation of an electrode lamination proximal a magnetically free layer. Such dead layer mitigation can optimize magnetic stability, efficiency, sensitivity, and interlayer coupling to minimize the physical size of the magnetic element. Additionally, an electrode lamination with a tuned transition metal layer can be constructed proximal a fixed magnetization reference structure to control the magnetic coercivity and layer grain size. It should be noted that while the embodiments have been directed to magnetic sensing, it will be appreciated that the claimed technology can readily be utilized in any number of other applications, including data writing applications.

It is to be understood that even though numerous characteristics and configurations of various embodiments of the present disclosure have been set forth in the foregoing description, together with details of the structure and function of various embodiments, this detailed description is illustrative only, and changes may be made in detail, especially in matters of structure and arrangements of parts within the principles of the technology to the full extent indicated by the broad general meaning of the terms in which the appended claims are expressed. For example, the particular elements may vary depending on the particular application without departing from the spirit and scope of the present disclosure.

What is claimed is:

1. A magnetic element comprising a magnetoresistive stack comprising an electrode lamination having at least a transition metal layer disposed between a magnetically free layer of the magnetoresistive stack and an electrode layer of the electrode lamination, the magnetically free layer comprising a first dead layer portion that is magnetically unresponsive, the transition metal layer contacting a magnetic shield, the electrode layer of the electrode lamination and the first dead layer portion.

2. The magnetic element of claim 1, wherein the transition metal layer comprises a material chosen from the group of Pt, Pd, Rh, and Ir.

3. The magnetic element of claim 1, wherein the magnetoresistive stack comprises a trilayer lamination with dual magnetically free layers and without a fixed magnetization.

4. The magnetic element of claim 1, wherein the magnetoresistive stack comprises a fixed magnetization reference structure opposite a non-magnetic spacer layer from a magnetically free layer.

5. The magnetic element of claim 1, wherein the transition metal layer is shaped with a varying thickness along a plane parallel to an air bearing surface when the magnetic element is incorporated in a data storage apparatus.

6. The magnetic element of claim 1, wherein the transition metal layer has a first thickness and the electrode layer has a second thickness, the first thickness being greater than the second thickness.

7. The magnetic element of claim 1, wherein the transition metal layer has a uniform thickness along a plane parallel to an air bearing surface when the magnetic element is incorporated in a data storage apparatus.

8. The magnetic element of claim 1, wherein the electrode layer has a second dead layer portion.

9. The magnetic element of claim 8, wherein the first dead layer portion has a greater thickness than the second dead layer portion.

10. The magnetic element of claim 1, wherein the first dead layer portion continuously extends from a first side of the magnetoresistive stack to an opposite second side of the magnetoresistive stack.

11. An apparatus comprising a magnetoresistive stack comprising first and second electrode laminations each having a transition metal layer and an electrode layer, the first electrode lamination disposed between a magnetically free layer of the magnetoresistive stack and a first magnetic shield, the second electrode lamination disposed between a second magnetic shield and a reference structure of the magnetoresistive stack, the magnetically free layer comprising a dead layer portion that is magnetically unresponsive, the first electrode lamination comprising a first transition metal layer contacting the dead layer portion and the electrode layer, the second electrode lamination comprising a second transition metal layer contacting a magnetic seed layer of the second electrode lamination and a pinning layer.

12. The apparatus of claim 11, wherein the first electrode lamination has a first transition metal layer having a different thickness than a second transition metal layer of the second electrode lamination.

13. The apparatus of claim 11, wherein the first electrode lamination has a first transition metal layer comprising a different material than a second transition metal layer of the second electrode lamination.

14. The apparatus of claim 11, wherein the first electrode lamination has a first transition metal layer having a different shape than a second transition metal layer of the second electrode lamination.

15. The apparatus of claim 11, wherein the second electrode lamination contacts a pinning layer of the magnetoresistive stack.

16. The apparatus of claim 11, wherein a first electrode layer of the first electrode lamination comprises a different material than a second electrode layer of the second electrode lamination.

17. An apparatus comprising a magnetoresistive stack disposed between top and bottom shields, the magnetoresistive stack comprising an electrode lamination disposed between a magnetically free layer and the top shield, the electrode lamination comprising a transition metal layer contacting a dead layer portion of the magnetically free layer and an electrode layer of the electrode lamination by continuously extending about the electrode layer on three different sides, the dead layer portion being magnetically unresponsive.

18. The apparatus of claim 17, wherein the transition metal layer has a varying thickness measured parallel to a longitudinal axis and the electrode layer has a uniform thickness along the longitudinal axis.

* * * * *